US011264416B2

(12) United States Patent
Suzuki et al.

(10) Patent No.: US 11,264,416 B2
(45) Date of Patent: Mar. 1, 2022

(54) IMAGE PROCESSING APPARATUS AND IMAGE PROCESSING METHOD (71) Applicant: KDDI CORPORATION, Tokyo (JP)

(72) Inventors: Masahiro Suzuki, Fujimino (JP); Tomoaki Ueda, Tokyo (JP)

(73) Assignee: KDDI CORPORATION, Tokyo (JP)

( * ) Notice: Subject to any disclaimer, the term of this patent is extended or adjusted under 35 U.S.C. 154(b) by 379 days.

(21) Appl. No.: 16/393,206

(22) Filed: Apr. 24, 2019

(65) Prior Publication Data
US 2019/0252431 A1 Aug. 15, 2019

Related U.S. Application Data

(63) Continuation of application No. PCT/JP2017/034625, filed on Sep. 26, 2017.

(30) Foreign Application Priority Data

Nov. 15, 2016 (JP) .............................. JP2016-222325

(51) Int. Cl.
| | |
|---|---|
| *H01L 27/146* | (2006.01) |
| *H04N 5/232* | (2006.01) |
| *H04N 5/341* | (2011.01) |
| *G06T 7/50* | (2017.01) |
| *G06F 9/30* | (2018.01) |
| *G06T 7/00* | (2017.01) |

(52) U.S. Cl.
CPC ...... *H01L 27/14605* (2013.01); *G06F 9/3004* (2013.01); *G06T 7/00* (2013.01); *G06T 7/50* (2017.01); *H04N 5/23229* (2013.01); *H04N 5/341* (2013.01)

(58) Field of Classification Search
CPC .... H04N 5/23229; H04N 5/341; H04N 9/045; G06T 7/50; G06T 7/00; G06F 9/3004; H01L 27/14605
See application file for complete search history.

(56) References Cited

U.S. PATENT DOCUMENTS

| | | | |
|---|---|---|---|
| 9,699,386 B2 | 7/2017 | Kitajima | |
| 2011/0205235 A1* | 8/2011 | Mishima | ................... G06T 7/13 345/581 |

(Continued)

FOREIGN PATENT DOCUMENTS

| | | |
|---|---|---|
| JP | H11-283033 A | 10/1999 |
| JP | 2009-244229 A | 10/2009 |

(Continued)

OTHER PUBLICATIONS

International Search Report for PCT/JP2017/034625 dated May 24, 2018 (partially translated).

*Primary Examiner* — Abdelaaziz Tissire
*Assistant Examiner* — John H Morehead, III
(74) *Attorney, Agent, or Firm* — Thomas | Horstemeyer, LLP (57) ABSTRACT

An image processing apparatus comprises means for selecting, from a single image, a range where a target pixel is made to be a reference, means for approximating a distribution of pixel values of the selected range by a function that represents a curved surface, and means for calculating a vector related to the distribution of pixel values from a parameter of the function obtained as a result of the approximation.

13 Claims, 9 Drawing Sheets

(56) References Cited

U.S. PATENT DOCUMENTS

| | | | | |
|---|---|---|---|---|
| 2012/0076420 A1* | 3/2012 | Kono | ..................... | H04N 5/142 |
| | | | | 382/199 |
| 2013/0022285 A1* | 1/2013 | Suzuki | ................... | H04N 19/18 |
| | | | | 382/233 |
| 2013/0235087 A1* | 9/2013 | Kashibuchi | ............... | G06T 7/60 |
| | | | | 345/660 |
| 2020/0351456 A1* | 11/2020 | Suzuki | ................... | H04N 1/409 |

FOREIGN PATENT DOCUMENTS

| | | |
|---|---|---|
| JP | 2016-086246 A | 5/2016 |
| WO | 2018/092422 A1 | 5/2018 |

\* cited by examiner

| PIXEL COORDINATES | NORMAL VECTO |
|---|---|
| ⋮ | ⋮ |
| (10,20) | (0.3,-0.5,-0.1) |
| (11,20) | (0.2,-0.4,0.1) |
| ⋮ | ⋮ |

IMAGE PROCESSING APPARATUS AND IMAGE PROCESSING METHOD

CROSS-REFERENCE TO RELATED APPLICATIONS

This application is a continuation of International Patent Application No. PCT/JP2017/034625 filed on Sep. 26, 2017, which claims priority to and the benefit of Japanese Patent Application No. 2016-222325 filed on Nov. 15, 2016, the entire disclosures of which are incorporated herein by reference.

TECHNICAL FIELD

The present invention relates to an image processing apparatus and an image processing method.

BACKGROUND ART

In accompaniment of improvements in capabilities and an increase in the number of functions of mobile terminals such as smart phones, applications for which it is necessary to perform advanced security management have come out. For example, applications that provide Internet banking functions, applications that enable securities trading, and the like have come to be available. Such applications normally require user authentication in order to perform security management. User authentication is normally performed by a user ID and a password, but in recent years, fingerprint and palm print authentication by which stronger security can be implemented have started to be used. However, currently, in order to enable fingerprint/palm print authentication, it has been necessary to provide a dedicated fingerprint sensor in the smart phone, or to separately implement a function for detecting a palm print by some means, and there is a problem in terms of cost and space for mounting on the device.

In PTL1, a technique by which it is possible to obtain a more realistic three-dimensional image from image information using a simple measurement apparatus such as a digital camera is disclosed.

CITATION LIST

Patent Literature

PTL1: Japanese Patent Laid-Open No. 2009-244229

SUMMARY OF INVENTION

Technical Problem

In a digital camera mounted in a mobile terminal such as a smart phone, generally only images compressed according to a JPEG format are recorded, and therefore it is difficult to extract a detailed fingerprint or palm print by conventional image processing as is described in PTL1, for example. The reason for this is that JPEG data is the result of further compressing RGB color image data for which there is only 8 bits respectively in the first place, and when the compressed data is decompressed to the size of the original image and differential operation processing (differential calculation) for unevenness extraction is further performed, noise becomes worse.

Among A/D converters integrated in high-end single lens reflex camera image capturing elements, there are those of 12-bit precision, but most image capturing elements of mobile terminals are of a precision of only 8 bits for each of R, G, and B. Furthermore, since generally only images compressed in the JPEG format are recorded/saved, decompressed images have a relatively large amount of quantization noise, and that noise is an obstruction to a differential operation for obtaining fine unevenness. Also, it is known that when an ISO sensitivity increases, noise occurs in an image capturing apparatus (sensor) itself, there is a large amount of noise in addition to compression noise in the image capturing sensor, and this noise may be an obstruction to a differential operation for obtaining a fine unevenness.

The present invention was conceived in view of these problems, and an object thereof is to provide an image processing technique by which it is possible to reduce the influence of noise that occurs when image capturing and noise that occurs due to compression/decompression.

Solution to Problem

An embodiment of the present invention is related to an image processing apparatus. The image processing apparatus comprises means for selecting, from a single image, a range where a target pixel is made to be a reference, means for approximating a distribution of pixel value of the selected range by a function that represents a curved surface, and means for calculating a vector related to the distribution of pixel values from a parameter of the function obtained as a result of the approximation.

Additionally, any combination of the above configuration elements and substitutes for the configuration elements and expressions of the present invention between an apparatus, a method, a system, a computer program, a storage medium storing a computer program or the like may be embodiments of the present invention.

Advantageous Effects of Invention

According to the present invention, in image processing, it is possible to reduce the influence of noise that occurs when image capturing and noise that occurs due to compression/decompression.

Further features and advantages of the present invention will become apparent from the following description with reference to the attached drawings.

DESCRIPTION OF EMBODIMENTS

Hereinafter, the same or equivalent components, members, and processes illustrated in the drawings are denoted by the same reference numerals, and a repetitive description thereof will be omitted. Further, some members that are not important to the description in each drawing are omitted.

In the embodiments, without using a dedicated sensor or attachment, unevenness information is extracted from an image that can be obtained by a camera function that is typically implemented in a mobile terminal such as a smart phone. The inventors focused on the fact that for a sub-region that is within an image that was captured by a mobile terminal (in particular a color image of a high-resolution exceeding 8M pixels), the brightness and the distance of illumination light (light beam distance attenuation) from the camera are extremely large compared to a rectangular sub-region, and therefore are approximately the same across all of the pixels in the rectangular sub-region, and an approximation that an object color and a light absorption level are approximately the same may be established. In other words, the inventors found that by parabolic surface approximation processing according to a least squares method that uses all of the pixel data in a rectangular sub-region, it is possible to suppress noise in each pixel. In embodiments, based on such an approximation, a luminance distribution is approximated by a parabolic surface according to the least squares method in relation to a rectangular sub-region that includes not only specific pixels of data that were loosely compressed, such as with JPEG data, but also surrounding pixels, and a normal vector is extracted based on parameters of a parabolic surface obtained as a result of the approximation. Thereby, it is possible to extract unevenness information at a high precision while suppressing noise.

Embodiments

Figure 1:
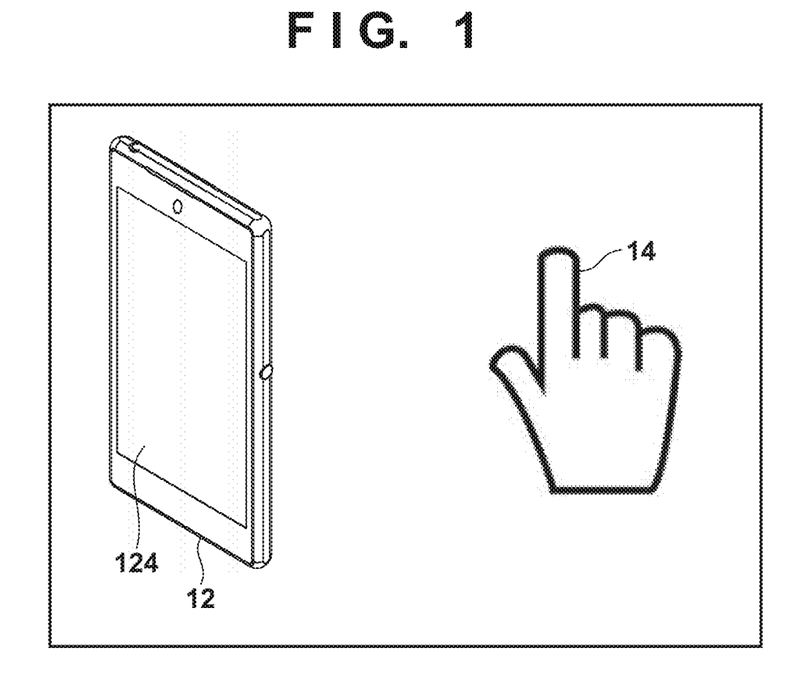
FIG. 1 A schematic drawing of a mobile terminal according to embodiments.

FIG. 1 is a schematic drawing of a mobile terminal 12 according to embodiments. The mobile terminal 12 comprises a display 124 and an image capturing unit (not shown in FIG. 1) such as a camera. A user of the mobile terminal 12 captures their own finger 14 or someone else's by an image capturing unit. The image capturing unit compresses an image of the finger 14, obtained by the capturing, in a lossy compression format such as JPEG, and registers the result in a memory (not shown in FIG. 1). The mobile terminal 12 reads the compressed image of the finger 14 from the memory and decompresses it. The mobile terminal 12 processes the decompressed image of the finger 14 obtained as the result of decompression to generate an unevenness image of the finger 14, and displays it on the display 124. Alternatively, the mobile terminal 12 may composite the unevenness image and the original decompressed image, may compare the unevenness image with another unevenness image obtained by capturing the finger 14 from another viewpoint, and may compare fingerprint information of the finger 14 that was obtained in advance and fingerprint information obtained from the unevenness image.

The mobile terminal 12 may be a smart phone, a tablet, a mobile phone, or a laptop computer. The mobile terminal 12 is an image processing apparatus that has an image processing function. The mobile terminal 12 holds an application program for implementing an image processing function. The application program may be pre-installed on the mobile terminal 12, and may be downloaded to the mobile terminal 12 via a network.

In the present embodiment, the mobile terminal 12 is described as an example, but it will be clear to a person having ordinary skill in the art who has come into contact with the present specification that it is possible to apply the technical concept according to the present embodiment to any image processing apparatus, such as a digital camera, a video camera, a server, a desktop computer, or the like.

Figure 2:
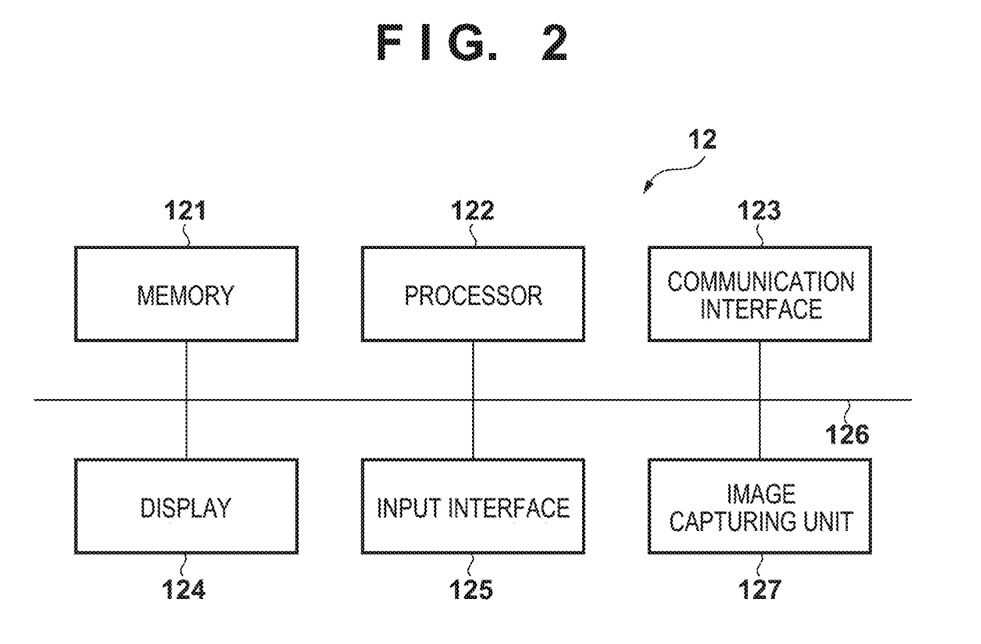
FIG. 2 A hardware configuration view of the mobile terminal of FIG. 1.

FIG. 2 is a hardware configuration view of the mobile terminal 12 of FIG. 1. The mobile terminal 12 includes a memory 121, a processor 122, a communication interface 123, a display 124, an input interface 125, and an image capturing unit 127. These elements are each connected to a bus 126, and communicate with each other via the bus 126.

The memory 121 is a storage region for storing data and programs. Data and programs may be stored permanently in the memory 121, and may be stored temporarily. In particular, the memory 121 stores an application program. The processor 122 implements various functions in the mobile terminal 12 by executing application programs stored in the memory 121. The communication interface 123 is an interface for performance of transmission/reception of data between the mobile terminal 12 and an external unit. For example, the communication interface 123 includes an interface for accessing a wireless communication network for mobile phones, an interface for accessing a wireless LAN (Local Area Network), or the like. Also, the communication interface 123 may include an interface for a wired network such as USB (Universal Serial Bus), for example. The display 124 is a device for displaying various information, and is a liquid crystal display or an organic EL (electroluminescence) display, or the like, for example. The input interface 125 is a device for accepting input from a user. The input interface 125 includes a touch panel disposed on the display 124, various input keys, and the like, for example. The image capturing unit 127 includes a lens, an image capturing elements such as a CCD, a CMOS, or the like, and a circuit for compression processing, for example.

Figure 3:
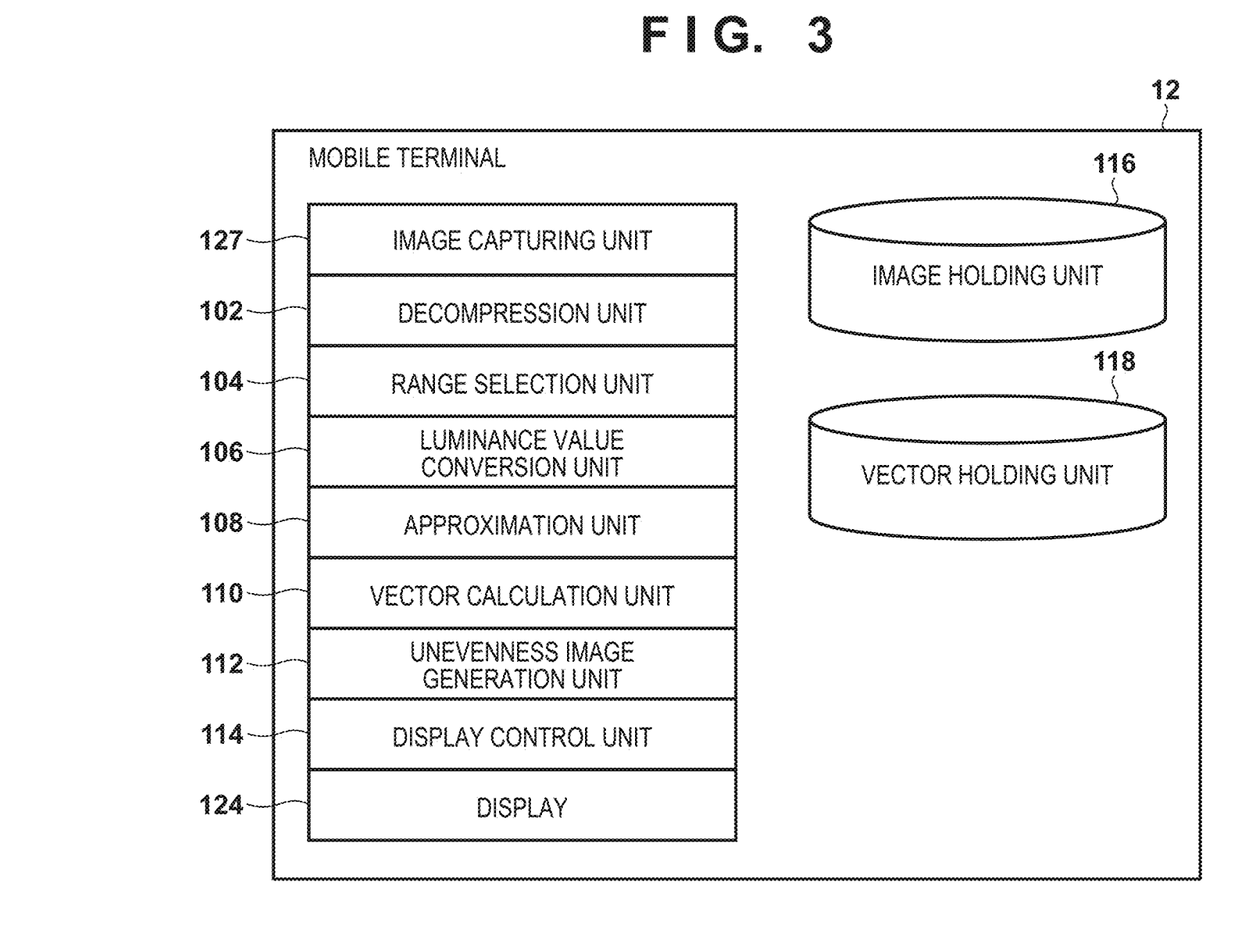
FIG. 3 A block diagram for illustrating functions and configurations of the mobile terminal of FIG. 1.

FIG. 3 is a block diagram for illustrating functions and configurations of the mobile terminal 12 of FIG. 1. Each block illustrated here can be implemented in hardware with elements such as a CPU of a computer and mechanical apparatuses, or implemented in software by a computer program or the like, but here functional blocks realized by cooperation therebetween are illustrated. Accordingly, a person having ordinary skill in the art who came into contact with the present specification will understand that these functional blocks can be realized in various forms by combination of hardware and software.

The mobile terminal 12 comprises an image capturing unit 127, a decompression unit 102, a range selection unit 104, a luminance value conversion unit 106, an approximation unit 108, a vector calculation unit 110, an unevenness image generation unit 112, a display control unit 114, an image holding unit 116, a vector holding unit 118, and a display 124. The image holding unit 116 and the vector holding unit 118 may each be storage regions defined within the memory 121.

The image capturing unit 127 performs image capturing of an image capturing target such as a finger in accordance with an instruction of a user accepted via an input interface 125, for example. The image capturing unit 127 generates an image of the image capturing target, compresses the generated image in the JPEG format, and registers it in the image holding unit 116.

The decompression unit 102, in accordance with an instruction of a user accepted via the input interface 125, for example, obtains an image compressed in the JPEG format from the image holding unit 116. The decompression unit 102 generates a decompressed image by decompressing the obtained image.

The range selection unit 104 selects a range where a target pixel is made to be a reference from one decompressed image generated by the decompression unit 102. In particular, the range selection unit 104 selects the target pixel from among the pixels of the decompressed image, and selects rectangular region (hereinafter referred to as "rectangular sub-region") of n times n pixels (n is an odd number greater than or equal to 3) whose center is the selected target pixel. Additionally, n may be an even number.

Figure 4:
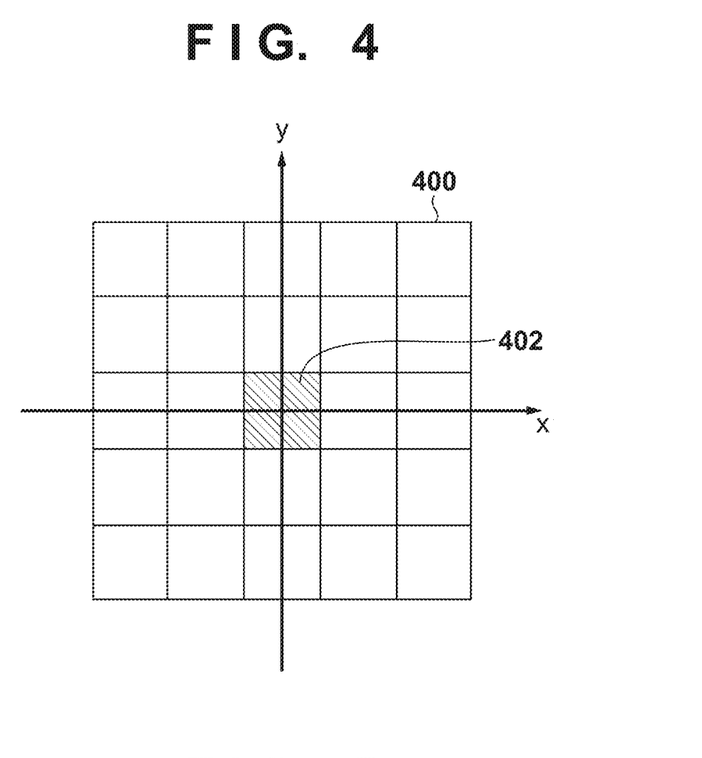
FIG. 4 A schematic drawing illustrating an example of a rectangular sub-region.

FIG. 4 is a schematic drawing illustrating an example of a rectangular sub-region 400. In this example, the rectangular sub-region 400 is a rectangular region of 5 times 5 pixels whose center is the target pixel 402. In the rectangular sub-region 400, a total of 25 pixels are included. In a case where a computation is performed for this rectangular sub-region 400, the origin of integer coordinates which are xy coordinates is made to be the center of the central target pixel 402.

Below, a case in which the 5 times 5 pixel rectangular sub-region 400 is employed will be described. However, it will be clear to a person having ordinary skill in the art who came into contact with the present specification that an appropriately sized rectangular sub-region of, for example, 3 times 3 pixels, 7 times 7 pixels, 9 times 9 pixels, 11 times 11 pixels, 3 times 5 pixels, 7 times 3 pixels or the like may be used. Alternatively, for a value of n of the rectangular sub-region, a numerical value that is optimal for obtaining the required processing result may be selected. In other words, since there are various actual embodiments for the size and number of pixels of the finger, an n that is optimal for the desired result may be selected automatically.

Returning to FIG. 3, the luminance value conversion unit 106 converts the RGB value of each pixel of one decompressed image generated by the decompression unit 102 into a luminance value Y. For example, the following Expression 1 can be used for this conversion.

$$Y = 0.299 \times R + 0.587 \times G + 0.114 \times B \quad \text{(Expression 1)}$$

By conversion by the luminance value conversion unit 106, a two-dimensional distribution of luminance values in the rectangular sub-region 400 is obtained.

The approximation unit 108 approximates, by a function O(x, y) representing a parabolic surface (elliptical parabolic surface) that uses a least squares method, a two-dimensional distribution of luminance values of the rectangular sub-region 400 selected by the range selection unit 104. The function O(x, y) representing the parabolic surface is given by Expression 2 below.

$$O(x,y) = ax^2 + bx + cy^2 + dy + e \quad \text{(Expression 2)}$$

Here, each of a, b, c, d, and e are unknown numbers. The luminance value of the j-th pixel (coordinates $(x_j, y_j)$) in the rectangular sub-region 400 is denoted $S(x_j, y_j)$. An error evaluation function E in the least squares method is given by Expression 3 below (in the case of 5 times 5, n=25, similar below).

(Expression 3)

$$E = \sum_{j=1}^{n} \{S(x_j, y_j) - O(x_j, y_j)\}^2 \quad \text{[EQUATION 1]}$$

A necessary condition for the least squares method is $$\frac{\partial E}{\partial a} = 0, \frac{\partial E}{\partial b} = 0, \frac{\partial E}{\partial c} = 0, \frac{\partial E}{\partial d} = 0, \frac{\partial E}{\partial e} = 0, \quad \text{[EQUATION 2]}$$

and therefore five simultaneous equation are obtained regarding the unknown numbers a, b, c, d, e. When these are arranged in a determinant, $$\begin{bmatrix} \sum_{j=1}^{n} x_j^4 & \sum_{j=1}^{n} x_j^3 & \sum_{j=1}^{n} x_j^2 y_j^2 & \sum_{j=1}^{n} x_j^2 y_j & \sum_{j=1}^{n} x_j^2 \\ \sum_{j=1}^{n} x_j^3 & \sum_{j=1}^{n} x_j^2 & \sum_{j=1}^{n} x_j y_j^2 & \sum_{j=1}^{n} x_j y_j & \sum_{j=1}^{n} x_j \\ \sum_{j=1}^{n} x_j^2 y_j^2 & \sum_{j=1}^{n} x_j y_j^2 & \sum_{j=1}^{n} y_j^4 & \sum_{j=1}^{n} y_j^3 & \sum_{j=1}^{n} x_j^2 \\ \sum_{j=1}^{n} x_j^2 y_j & \sum_{j=1}^{n} x_j y_j & \sum_{j=1}^{n} y_j^3 & \sum_{j=1}^{n} y_j^2 & \sum_{j=1}^{n} y_j \\ \sum_{j=1}^{n} x_j^2 & \sum_{j=1}^{n} x_j & \sum_{j=1}^{n} y_j^2 & \sum_{j=1}^{n} y_j & n \end{bmatrix} \begin{bmatrix} a \\ b \\ c \\ d \\ e \end{bmatrix} = \begin{bmatrix} \sum_{j=1}^{n} x_j^2 S(x_j, y_j) \\ \sum_{j=1}^{n} x_j S(x_j, y_j) \\ \sum_{j=1}^{n} y_j^2 S(x_j, y_j) \\ \sum_{j=1}^{n} y_j S(x_j, y_j) \\ \sum_{j=1}^{n} S(x_j, y_j) \end{bmatrix} \quad \text{[EQUATION 3]}$$

is obtained.

Figure 5:
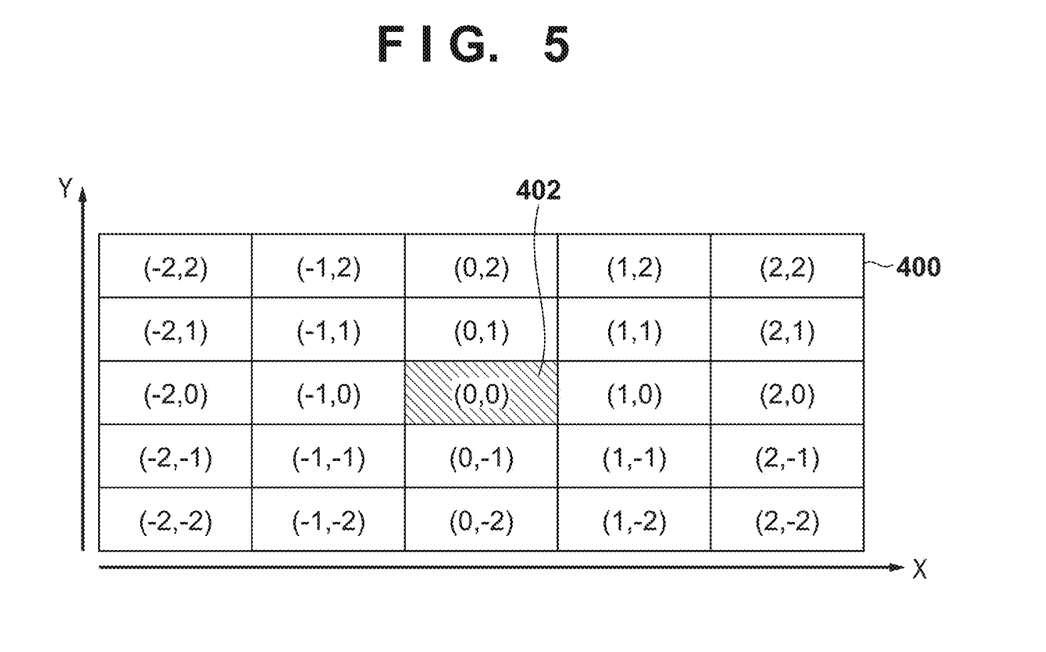
FIG. 5 A schematic drawing illustrating coordinates of each pixel of the rectangular sub-region.
Figure 13:
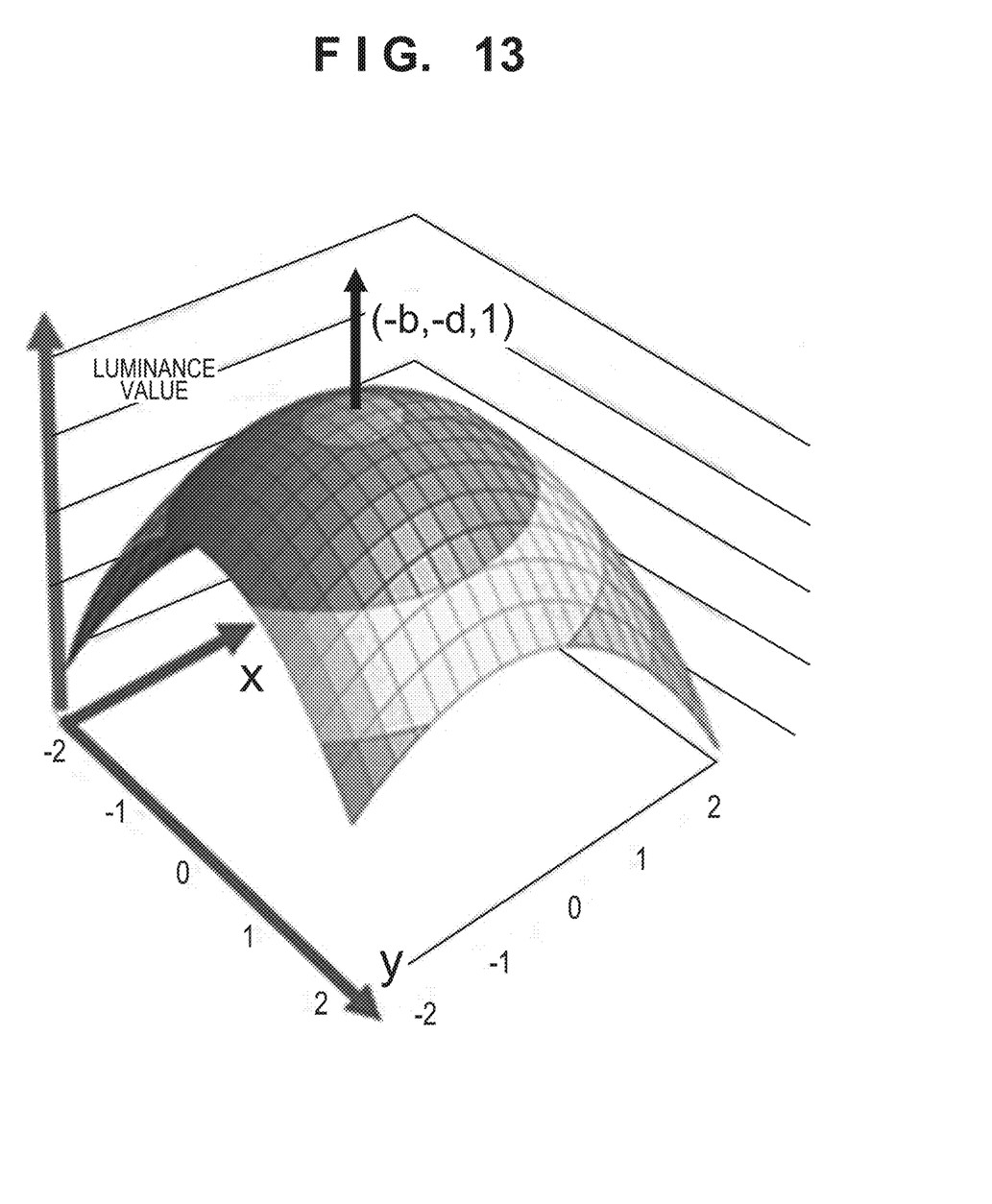
FIG. 13 A graph illustrating a function O(x, y) representing a parabolic surface after an approximation.

The xy coordinates of the rectangular sub-region 400 are such that the center, specifically the target pixel 402, is the origin. FIG. 5 is a schematic drawing illustrating coordinates of each pixel of the rectangular sub-region 400. When the left side 5 times 5 matrix of the foregoing determinant is calculated, $$\begin{bmatrix} 170 & 0 & 100 & 0 & 50 \\ 0 & 50 & 0 & 0 & 0 \\ 100 & 0 & 170 & 0 & 50 \\ 0 & 0 & 0 & 50 & 0 \\ 50 & 0 & 50 & 0 & 25 \end{bmatrix} \begin{bmatrix} a \\ b \\ c \\ d \\ e \end{bmatrix} = \begin{bmatrix} \sum_{j=1}^{n} x_j^2 S(x_j, y_j) \\ \sum_{j=1}^{n} x_j S(x_j, y_j) \\ \sum_{j=1}^{n} y_j^2 S(x_j, y_j) \\ \sum_{j=1}^{n} y_j S(x_j, y_j) \\ \sum_{j=1}^{n} S(x_j, y_j) \end{bmatrix}$$ [EQUATION 4]

is obtained. When this is solved for the unknown numbers b and d, $$b = \frac{1}{50} \sum_{j=1}^{n} x_j S(x_j, y_j)$$

$$d = \frac{1}{50} \sum_{j=1}^{n} y_j S(x_j, y_j)$$ [EQUATION 5]

is obtained. FIG. 13 illustrates the function O(x, y) representing a parabolic surface after approximation.

Returning to FIG. 3, the vector calculation unit 110 calculates a normal vector for the target pixel 402 of the function O(x, y) for approximating the distribution of luminance values. The normal vector is calculated from the parameters of the function obtained as the result of the approximation in the approximation unit 108, specifically the unknown numbers b and d. The vector calculation unit 110 associates and registers the coordinates of the target pixel 402 corresponding to the entire decompressed image and the calculated normal vector in the vector holding unit 118.

The tangent vectors at the origin (0,0) of the rectangular sub-region 400, specifically at the target pixel 402 are (1, 0, b) and (0, 1, d). The normal vector at the target pixel 402 is obtained by the outer product of these two tangent vectors.

$$(1, 0, b) \times (0, 1, d) =$$

$$(-b, -d, 1) = \left( -\sum_{j=1}^{n} x_j S(x_j, y_j), -\sum_{j=1}^{n} y_j S(x_j, y_j), 50 \right)$$ [EQUATION 6]

The vector calculation unit 110 calculates the normal vector by normalizing this. Using the luminance values of the 25 pixels of the rectangular sub-region 400, the influence of noise of the JPEG format is suppressed for the normal vector calculated after the approximation by the parabolic surface.

Figure 6:
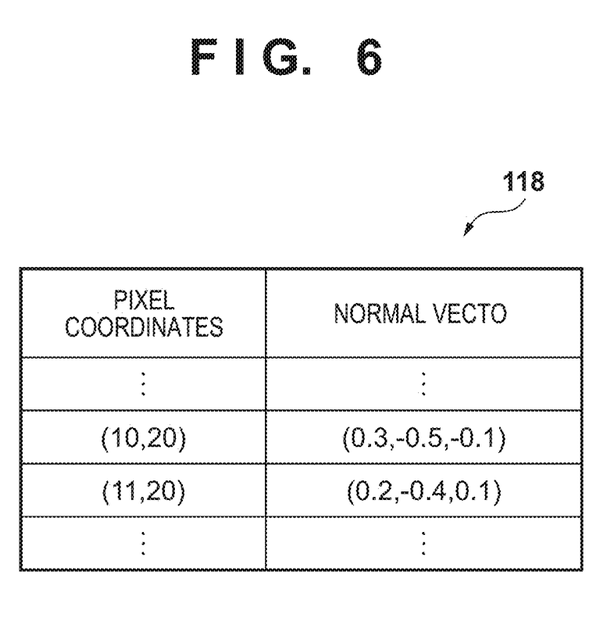
FIG. 6 A data structure diagram illustrating an example of a vector holding unit of FIG. 3.

FIG. 6 is a data structure diagram illustrating an example of a vector holding unit 118. The vector holding unit 118 associates and holds the coordinates of a pixel of the decompressed image and the normal vector calculated for that pixel.

Returning to FIG. 3, the unevenness image generation unit 112 generates an unevenness image which is a new image based on the normal vector calculated by the vector calculation unit 110 and a virtual light source. The unevenness image generation unit 112 positions a virtual point light source in the vicinity of the image capturing unit 127 of the mobile terminal 12. The object color is specified in accordance with the luminance value. The brightness is specified in accordance with strength of diffuse reflection light calculated based on the normal vector and the light source vector (camera vector). In particular, the brightness is specified in accordance with an angle formed by the normal vector and the light source vector, and more specifically in accordance with an inner product of the normal vector and the light source vector.

Since a light source calculation for computing diffuse reflection light based on a calculated normal vector and the virtual light source is performed, a stereoscopic effect of the unevenness image is enhanced. By the normal vector alone, the result is mere shading, and a two-dimensional image. Since diffuse reflection light computed as described above is similar to reflected light from actual unevenness on the surface of the image capturing target, it is possible to visualize the actual unevenness by the unevenness image.

The display control unit 114 displays the unevenness image generated by the unevenness image generation unit 112 on display 124.

Operation of the mobile terminal 12 according to the above configuration will be described.

Figure 7:
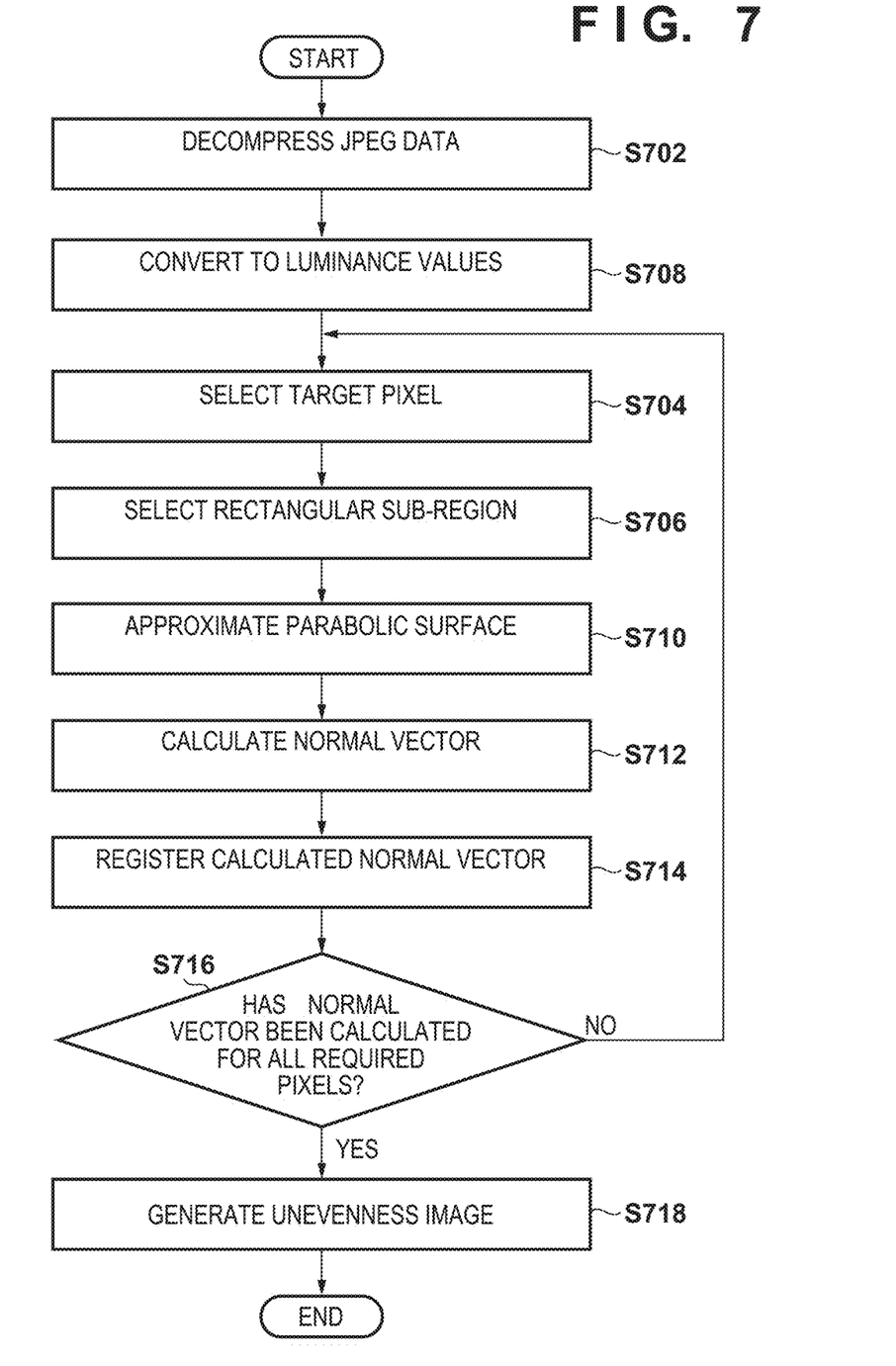
FIG. 7 A flowchart illustrating a flow of a sequence of processes in the mobile terminal of FIG. 1.

FIG. 7 is a flowchart illustrating a flow of a sequence of processes in the mobile terminal 12. The mobile terminal 12 reads data compressed in the JPEG format from the image holding unit 116 and decompresses it (step S7020). The mobile terminal 12 converts the RGB values of all pixels included in the decompressed image into luminance values (step S708). The mobile terminal 12 selects a target pixel from the pixels of the result of converting the decompressed image into luminance values (step S704). The mobile terminal 12 selects a rectangular sub-region whose center is the selected target pixel (step S706). The mobile terminal 12, by the least squares method, approximates the distribution of luminance values of the rectangular sub-region by the function for representing a parabolic surface (step S710). The mobile terminal 12, using the result of the approximation, calculates the normal vector of the parabolic surface at the target pixel of the rectangular sub-region (step S712). The mobile terminal 12 associates and registers in the vector holding unit 118 the calculated normal vector and the coordinates of the target pixel (step S714).

The mobile terminal 12 determines whether or not the normal vector was calculated for all of the necessary pixels in the decompressed image (step S716). In the case where there is a pixel for which a normal vector has not been calculated (NO in step S716), the processing returns to step S704. In step S704, the mobile terminal 12 selects the next target pixel. If the normal vector has been calculated for all pixels (YES in step S716), the mobile terminal 12 generates an unevenness image based on the normal vector calculated (step S718).

Figure 8A:
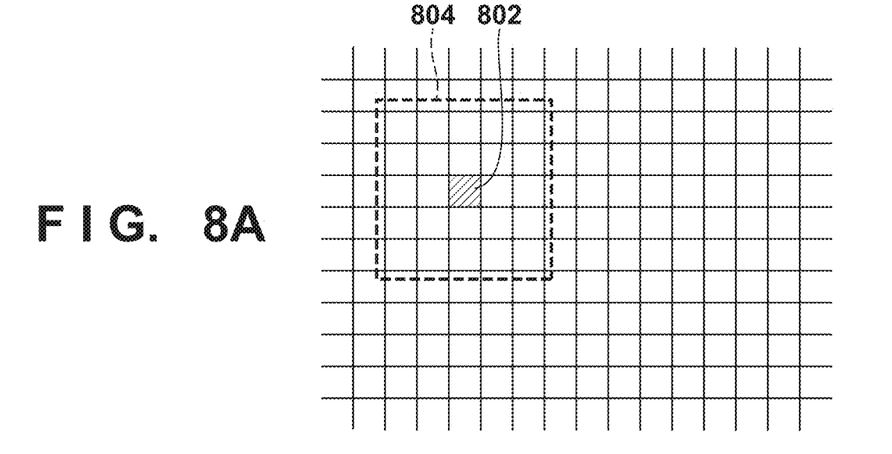
FIG. 8A is an explanatory diagram related to selection of a target pixel.
Figure 8B:
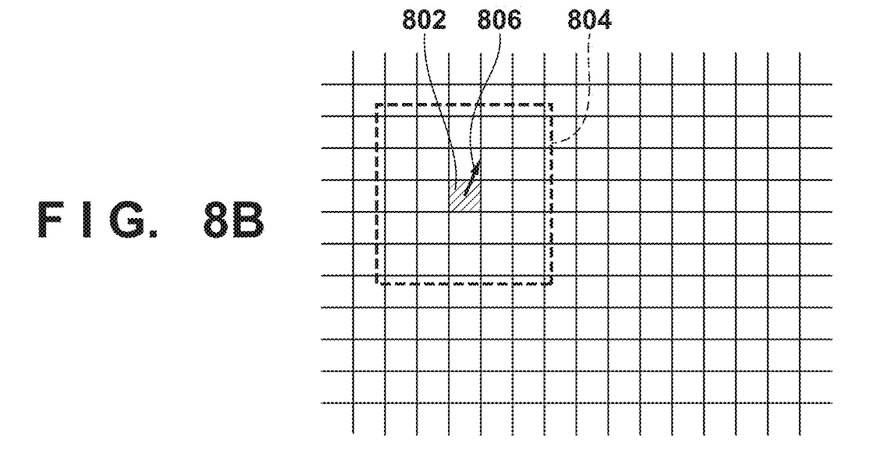
FIG. 8B is an explanatory diagram related to selection of a target pixel.
Figure 8C:
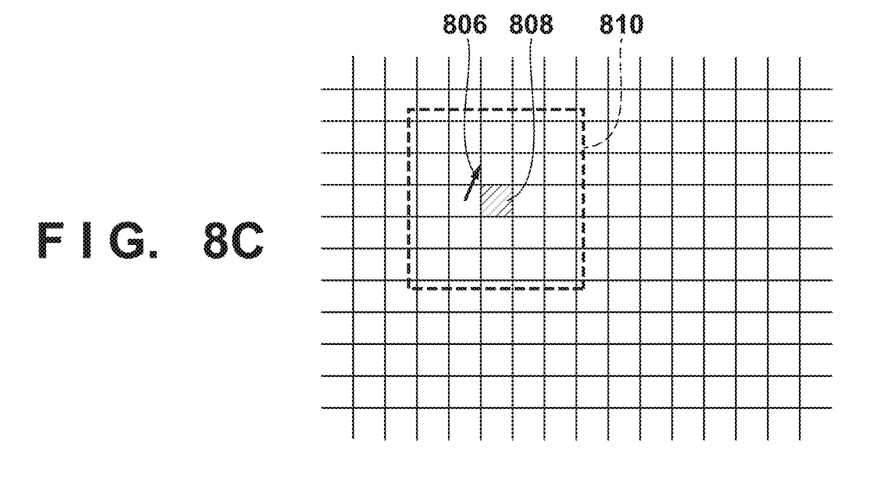
FIG. 8C is an explanatory diagram related to selection of a target pixel.

FIGS. 8A, 8B, and 8C are explanatory diagrams related to selection of a target pixel. In FIG. 8A, the rectangular sub-region 804 is selected in relation to the target pixel 802. By the above-described processing, the mobile terminal 12 calculates the normal vector 806 of target pixel 802 (FIG. 8B). The mobile terminal 12 selects the neighboring pixel 808 as the next target pixel, and sets the rectangular sub-region 810 in relation to the new target pixel 808 (FIG. 8C).

Note that for the pixels in the vicinity of the border of the decompressed image, there may be cases in which it is not possible to set a 5 times 5 pixel rectangular sub-region. In such cases, for example, configuration may be taken so as to not calculate the normal vector for pixels for which a 5 times 5 pixel rectangular sub-region cannot be set. Alternatively, configuration may be taken so that if a pixel in the vicinity of the border of the decompressed image is made to be the target pixel, the target pixel is not made to be the center of the rectangular sub-region. For example, configuration may be taken so that if the pixel of the top-left corner of the decompressed image is made to be the target pixel, a 5 times 5 rectangular sub-region whose top-left corner is the pixel is set.

In the above-described embodiment, an example of the holding units is a hard disk or a semiconductor memory. Also, based on the description of the present specification, a person having ordinary skill in the art who came into contact with the present specification would understand that each unit can be implemented by a CPU (not shown graphically), a semiconductor memory that temporarily stores a module of an installed application program, a module of a system program, and content of data read from a hard disk, or the like.

By virtue of the mobile terminal 12 according to the present embodiment, a distribution of luminance values of a rectangular sub-region whose center is a target pixel is approximated by a parabolic surface using the least squares method, and a normal vector at the target pixel is calculated from the result of the approximation. Accordingly, it is possible to reduce the influence of quantization noise accompanying an A/D conversion and JPEG compression, noise mixed in upon image capturing/measurement, and the like on the precision of a normal vector that is calculated.

Also, in the present embodiment, using the calculated normal vector, an unevenness image that indicates the unevenness of the surface of the image capturing target is generated. As described above, it is possible to generate an unevenness image that more clearly reproduces the surface of an image capturing target since the precision of a calculated normal vector is high.

Figure 9:
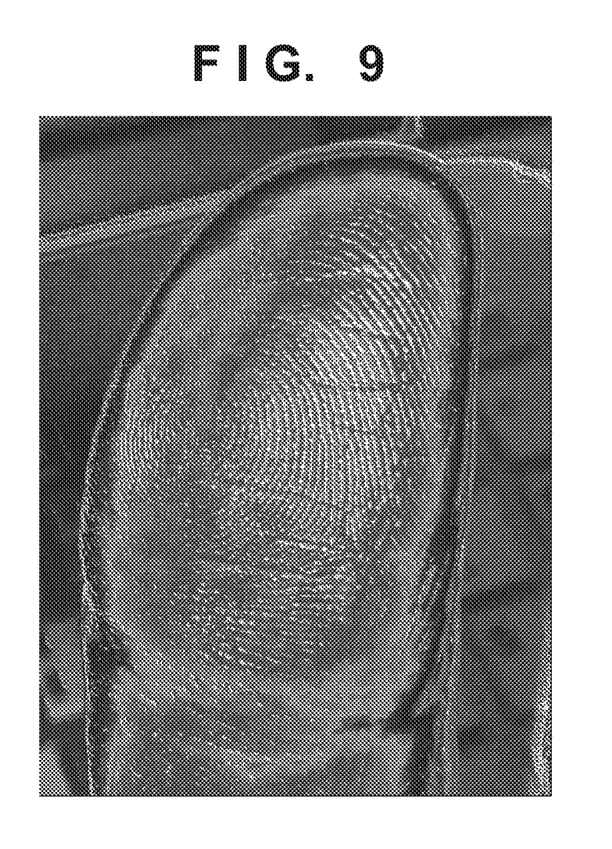
FIG. 9 A view illustrating an unevenness image of a finger obtained by an image processing method according to embodiments.

FIG. 9 is a view illustrating an unevenness image of a finger obtained by an image processing method according to embodiments. The fingerprint appears clearly in the unevenness image illustrated in FIG. 9, and unevenness on the order of 500 μm can be visualized clearly. Also, while at the decompressed image (not shown) stage, the background on the right side of the finger is substantially black and it is unclear what is there, it is possible to discern that there is a keyboard in the background in the unevenness image after image processing. This is also an effect due to the image processing method according to the present embodiment.

Figure 10:
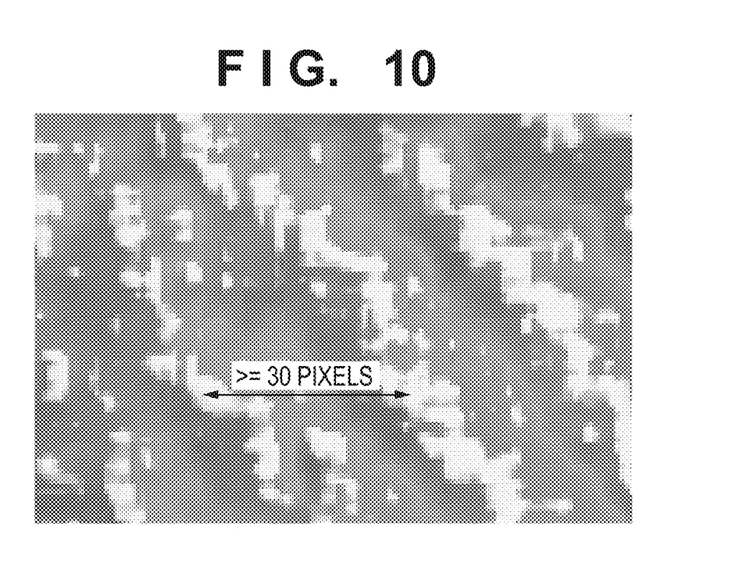
FIG. 10 A magnification view of a portion of a fingerprint included in the unevenness image of FIG. 9.

FIG. 10 is a magnification view of a portion of a fingerprint included in the unevenness image of FIG. 9. As illustrated in FIG. 10, the mobile terminal 12 according to the present embodiment can extract the fingerprint at a sufficient resolution. In this example, the unevenness of the creases in the fingerprint is obtained at a period of 30 pixels or more. Accordingly, configuration may be taken to, in the approximation of the parabolic surface, perform the calculation using a rectangular sub-region of a size of approximately 17 times 17 pixels, for example. In such a case, compared to the case where a 5 times 5 pixel rectangular sub-region is used, it is possible to extract an uneven shape of the object plane from more information.

Figure 11:
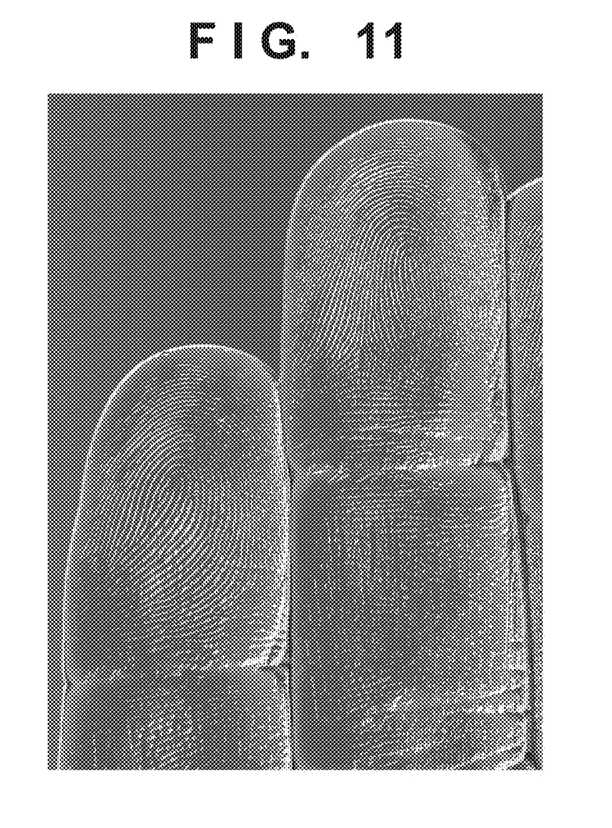
FIG. 11 A view illustrating another unevenness image of a finger obtained by an image processing method according to embodiments.
Figure 12:
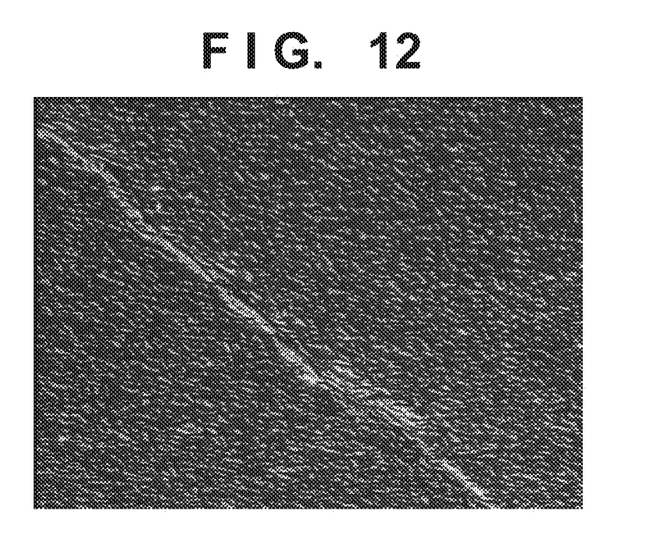
FIG. 12 A view illustrating another unevenness image of a surface of cardboard obtained by an image processing method according to embodiments.

FIG. 11 is a view illustrating another unevenness image of fingers obtained by an image processing method according to the present embodiment. FIG. 12 is a view illustrating an unevenness image of a surface of cardboard obtained by an image processing method according to embodiments. In the unevenness image of FIG. 12, it can be seen that creases and the unevenness of the surface are captured.

Even if the image capturing target surface is planar, if the color is different, the luminance values of the decompressed image will vary at the borders thereof. Accordingly, it is possible that in spite of the fact that it is planar, normal vectors will vary in the vicinity of color borders. Accordingly, the unevenness of the surface of the image capturing target can be more accurately reproduced in the unevenness image in the case where the image capturing target color is relatively uniform and the light source that actually illuminates the image capturing target is a parallel light source or a single light source.

In particular, if the resolution of the image capturing unit 127 of the mobile terminal 12 is high (for example, 8M pixels), the size of the surface of the image capturing target appearing in the 5 times 5 pixel rectangular sub-region is extremely small compared to the distance between that surface and the image capturing unit 127. Accordingly, as long as it is not an object that has a very fine color pattern, it is possible to treat the object colors of the surface of image capturing target appearing in the 5 times 5 pixel rectangular sub-region as approximately the same. Accordingly, the unevenness image obtained using the high-resolution image capturing unit 127 can more accurately reproduce the unevenness of the surface of the image capturing target.

Also, in the present embodiment, even without providing a dedicated sensor for detecting a fingerprint or a palm print, it is possible to obtain an unevenness image that can be used for fingerprint authentication and palm print authentication from an image obtained using a camera function normally provided in the mobile terminal.

APPLICATION EXAMPLES

In the embodiments, a case in which the unevenness image is generated using a normal vector is described, but the normal vector may be applied to various other image processes. For example, the mobile terminal 12 may comprise a matching unit (not shown) that matches a normal vector calculated for an image (hereinafter, referred to as "first image") obtained by capturing the finger 14 from a particular viewpoint with a corresponding normal vector calculated for an image (hereinafter referred to as "second image") obtained by capturing the finger 14 from another perspective.

The matching unit generates three-dimensional point group data by overlapping the first image and the second image. Since the normal vector indicates unevenness or outline of the surface of the finger 14 which is the image capturing target, overlapping of the first image and the second image is performed by computation processing of the respective normal vectors. The matching unit (1) obtains three-dimensional coordinates of two viewpoints based on feature points (2) performs coordinate rotation so as to match global space in relation to normal vectors of the first image and the second image.

In a case where the direction of normal vector of the first image and the direction of the normal vector of the second image match, the dot product of these normal vectors is 1. Accordingly, the matching unit performs shifting so that the dot product of the normal vectors becomes 1 (or approaches 1), and overlaps the first image and the second image by performing matching processing. Since computation of the dot product is relatively simple, it is possible to perform matching at high-speed and accurately by conventional pattern matching.

Also, by extraction of three-dimensional distance information according to a conventional stereo/matching method, the resolution of the distance information is low since matching is only performed based on feature points and boundary lines. However, by using the dot product between the normal vectors in matching two images in the application example, it becomes possible to perform matching in units of pixels. Accordingly, it is possible to perform matching of two images more accurately.

Note that three or more images may be overlapped.

Other application examples are generating a depth image from normal vectors by performing integration processing, using a fingerprint obtained from the unevenness image of a finger for fingerprint authentication, extracting an image capturing target from a decompressed image by overlapping an unevenness image and an original decompressed image, and generating a panorama image by joining together images. Also, configuration may be taken to apply an image processing method according to embodiments to the image obtained by a monitoring camera or an in-vehicle camera.

The above describes the configuration and operation of the mobile terminal 12 according to embodiments. A person having ordinary skill in the art will understand that the embodiments are only examples, and different variations are possible in each combination of the configuration elements and the processes, and that such variations are within the scope of the present invention.

In the embodiments, description was given of a case in which an image compressed in the JPEG format is decompressed, but limitation is not made to this, and an image that is obtained by decompressing an image compressed in another lossy compression format or in a lossless compression format may be used, and images that are not compressed/decompressed may be used.

In the embodiment, description is given of a case in which a 5 times 5 pixel rectangular sub-region whose center is a target pixel is selected, but limitation is not made to this. For example, the shape of the sub-region may be a square, a rectangle, a triangle, a hexagon, a diamond shape, or a circle. Also, a target pixel may be a pixel at any position in the sub-region, and may be at the corner of the sub-region, for example.

In the embodiments, description was given of a case where the RGB values of all of the pixels of the decompressed image are converted into luminance values, and thereafter a rectangular sub-region is selected, but limitation is not made to this, and the RGB values of pixels of a selected rectangular sub-region may be converted into luminance values each time.

In the embodiments, description was given of a case in which the distribution of luminance values in the rectangular sub-region is approximated, but limitation is not made to this, and a distribution of pixel values of pixels of a rectangular sub-region may be approximated, for example. In such a case, the pixel values may be only the R value, only the G value, or only the B value out of the RGB values, or may be a combination thereof, or other values specifying a feature of the pixel. Alternatively, a technical concept according to the embodiments may be applied to processing of an ultraviolet light image or an infrared light image.

In the embodiments, a case in which the distribution of luminance values is approximated by a function that represents a parabolic surface using a least squares method is described, but limitation is not made to this, and configuration may be taken so that, for example, a distribution of luminance values is approximated by a function that represents a curved surface. The curved surface may be a quadratic surface such as an elliptical surface or a parabolic surface. Also, a method other than the least squares method may be used as the approximation method.

In the embodiments, description of a case in which a normal vector is calculated from a parameter of a function obtained as the result of approximation, but limitation is not made to this, and configuration may be taken so that, for example, another vector such as a tangent vector is calculated.

Note, the present invention is not limited to the embodiments described above, and it is possible to make various modifications or changes without straying from the spirit and scope of the present invention. Therefore, to apprise the public of the scope of the present invention, the following claims are attached.

What is claimed is:

1. An image processing apparatus, comprising:
a processor, and
a memory including a program,
wherein the program, when executed by the processor, causes the processor to perform:
selecting, from a single image, a range where a target pixel is made to be a reference;
determining a function that represents a curved surface based on a distribution of pixel values of the selected range;
calculating a vector related to the distribution of pixel values from a parameter of the function; and
generating a new image based on the calculated vector and a virtual light source.

2. The image processing apparatus according to claim 1, wherein the vector is a normal vector of the function.

3. The image processing apparatus according to claim 1, wherein the function represents a quadratic surface, and is determined by using a least squares method.

4. The image processing apparatus according to claim 3, wherein the quadratic surface is a parabolic surface.

5. The image processing apparatus according to claim 1, wherein the pixel values include a luminance value of the pixel.

6. The image processing apparatus according to claim 1, wherein the range is a rectangular range whose center is the target pixel.

7. The image processing apparatus according to claim 1, wherein the program, when executed by the processor, causes the processor to perform matching the vector calculated for the single image and a corresponding vector calculated for another image.

8. The image processing apparatus according to claim 1, wherein the single image is an image obtained by decompressing a loosely compressed image.

9. The image processing apparatus according to claim 1, wherein the program, when executed by the processor, causes the processor to perform associating the target pixel and the calculated vector.

10. An image processing method, comprising:
selecting, from a single image, a range where a target pixel is made to be a reference;
determining a function that represents a curved surface based on a distribution of pixel values of the selected range;
calculating a vector related to the distribution of pixel values from a parameter of the function; and generating a new image based on the calculated vector and a virtual light source.

11. The image processing method according to claim 10, further comprising associating the target pixel and the calculated vector.

12. A non-transitory computer-readable storage medium storing a computer program for causing a computer to execute a method comprising:
- selecting, from a single image, a range where a target pixel is made to be a reference;
- determining a function that represents a curved surface based on a distribution of pixel values of the selected range;
- calculating a vector related to a distribution of pixel values from a parameter of a function; and
- generating a new image based on the calculated vector and a virtual light source.

13. The non-transitory computer-readable storage medium according to claim 12, wherein the program further causes the computer to realize a function of associating the target pixel and the calculated vector.

* * * * *